United States Patent
Weber et al.

[19]

[11] Patent Number: 6,007,634
[45] Date of Patent: Dec. 28, 1999

[54] VAPOR DEPOSITION APPARATUS

[75] Inventors: Rheinhart Weber, Tay Township; Michael Ryan Alberty, Hanmer; George Paul Tyroler, Lively; Ian Keith Passmore, Sudbury, all of Canada

[73] Assignee: Inco Limited, Toronto, Canada

[21] Appl. No.: 08/922,036

[22] Filed: Sep. 2, 1997

[51] Int. Cl.⁶ .................................................. C23C 16/46
[52] U.S. Cl. ..................... 118/725; 118/50; 118/728; 118/733; 156/345; 204/298.09
[58] Field of Search ........................ 118/50, 725, 728, 118/733; 156/345; 204/298.09

[56] References Cited

U.S. PATENT DOCUMENTS

| | | | |
|---|---|---|---|
| 2,496,054 | 1/1950 | Hoyler | 159/28.1 |
| 4,496,609 | 1/1985 | McNeilly et al. | 427/585 |
| 5,169,549 | 12/1992 | Weber | 249/80 |
| 5,470,651 | 11/1995 | Milinkovic et al. | 428/325 |
| 5,591,485 | 1/1997 | Weber | 427/250 |

FOREIGN PATENT DOCUMENTS

| | | |
|---|---|---|
| 2076578 | 2/1994 | Canada . |
| WO9425638A | 11/1994 | WIPO . |
| WO9521733 | 8/1995 | WIPO . |

OTHER PUBLICATIONS

"Toolmaking Without Machining . . . Long Term Research Pays Off.", Black, T.W., The Tool Engineer, vol. 44, No. 6, 1960, pp. 101–104.

*Primary Examiner*—Leo B. Tentoni
*Attorney, Agent, or Firm*—Edward A. Steen

[57] ABSTRACT

An apparatus (10) for decomposing and depositing gaseous metal carbonyls on a mandrel (36). A base plate (12) and cover (14) define a reaction chamber (20). A mandrel ring (28), nested within the base plate (12) and insulated therefrom, supports the mandrel (36). Heat transfer fluid flows through the mandrel ring (28) and into the mandrel (36) to maintain the mandrel (36) at a predetermined temperature to initiate thermal decomposition.

11 Claims, 4 Drawing Sheets

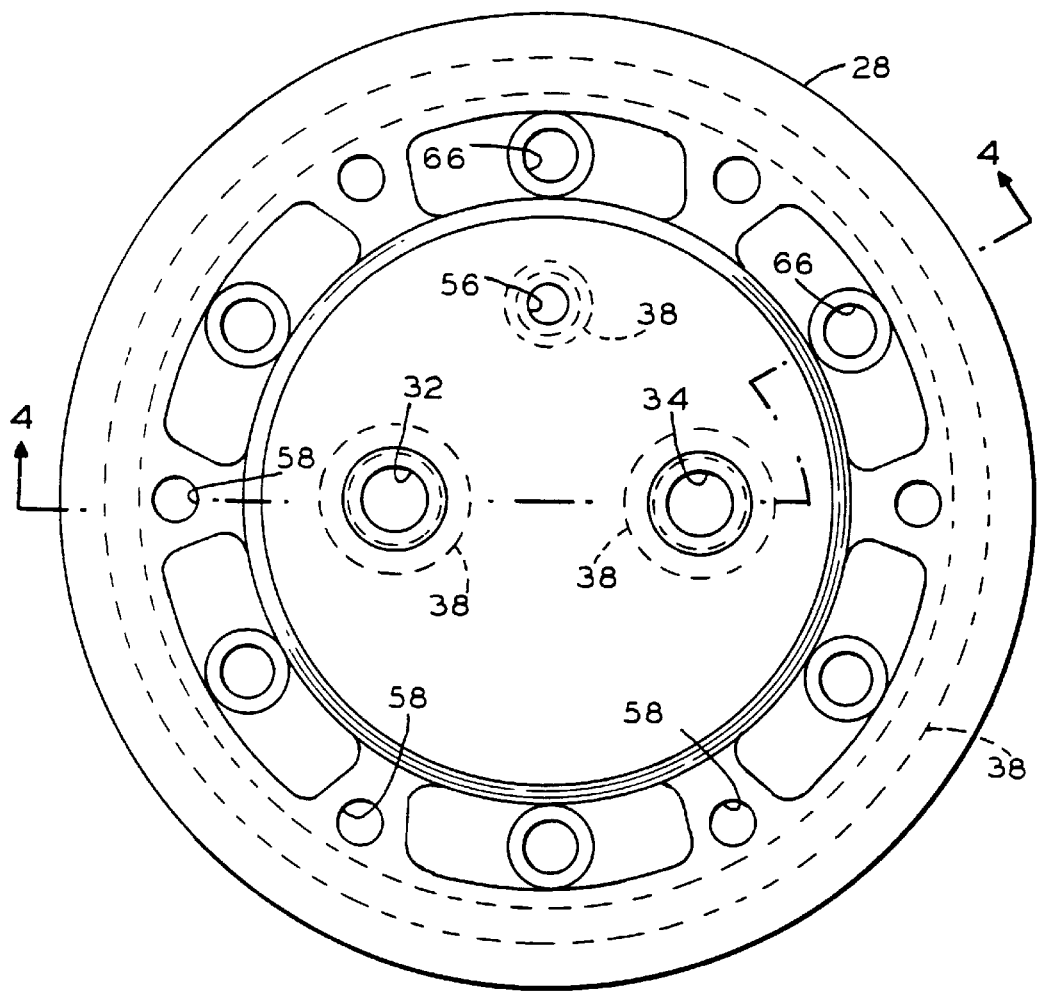
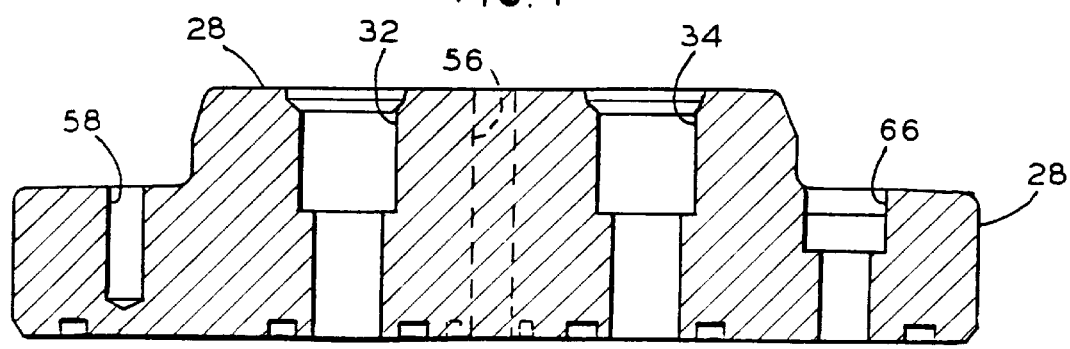

VAPOR DEPOSITION APPARATUS

TECHNICAL FIELD

The instant invention relates to chemical vapor deposition in general and, more particularly, to an apparatus for depositing gaseous metal carbonyls onto a substrate.

BACKGROUND ART

As discovered by Mond and Langer in 1889, nickel tetracarbonyl —$Ni(CO)_4$— readily decomposes into pure metallic nickel (Ni) and carbon monoxide (CO) within the temperature range of about 150–315° C. By encouraging the nickel to deposit onto a substrate, objects comprised of pure nickel may be produced.

Nickel vapor deposition (NVD) is a process whereby a solid nickel shape is produced by depositing nickel onto a preform or mandrel. The mandrel is sufficiently heated to cause the nickel carbonyl process gas to thermally decompose on contact with the mandrel surface. Carbon monoxide, produced from the decomposition and residual nickel carbonyl gas is vented away. Nickel is deposited onto the mandrel to a uniform thickness, replicating exactly all surface textures and shapes of the underlying mandrel. The nickel form is ultimately stripped away from the mandrel as a finished nickel product.

The surface of the mandrel must be clean before nickel will deposit. Even small amounts of contaminants, such as oil and grease (organics) will inhibit nickel deposition.

Currently, mandrel formed nickel objects are manufactured in a reaction cylinder split into two halves or chambers. The upper chamber and lower chamber are separated by a large gasket such as silicone or other material having a central aperture.

The upper chamber contains the mandrel and receives the nickel carbonyl gas. The lower chamber supports the mandrel and acts to contain any leaked carbonyl gas and as a sump for a suitable heat transfer fluid. The heat transfer fluid, maintained at an appropriate temperature, is either sprayed on the underside or circulated through the mandrel via tubes or internal bores and galleries to heat the mandrel.

The heat transfer fluid is piped through the wall of the lower chamber and sprayed onto the underside of the mandrel or taken directly into the mandrel. The fluid drains from the mandrel into the bottom chamber. A pump draws out the fluid from the sump, causing it to pass through a heater and return to the mandrel. A modification is to take the fluid directly out of the mandrel by pipe and exit through the bottom chamber.

The mandrel is disposed within the aperture of the above referenced gasket. A mechanical seal is provided around the mandrel and the aperture by compressing the gasket between the mandrel and keeper plates bolted into the side of the mandrel. An additional mechanical seal is provided at the outside edge of the gasket by compressing the outside edge of the gasket between flanges affixed to the upper and lower chambers. End plates are welded to the end of the cylindrical chamber halves to seal the entire apparatus.

An additional seal can be provided at the mandrel/gasket interface by the deposition of a bead of liquid silicone between the gasket and the mandrel.

It is imperative that the upper and lower chambers are separated from one another and the seals have integrity.

Unfortunately, gasket material often offgasses at NVD operating temperatures and contaminates the mandrel. Consequently, the large gaskets are often subjected to a lengthy post cure (offgassing) at operating temperatures before the gasket is compatible with the NVD process. Moreover, gaskets are expensive and easily damaged during mandrel disassembly.

The mandrel/gasket seal, provided by compression with the keeper plates or by bonding does not always provide a leak tight seal. Vapors of the fluid can pass through the mandrel/gasket seal into the upper chamber and contaminate the mandrel.

A modification was made to the bottom chamber to pipe the exit fluid from the mandrel through the wall of the chamber and eliminate the fluid from the lower chamber. However, significant manhours are required to clean fluid spillage from the lower chamber each time the mandrel is disassembled.

Moreover, nickel carbonyl leaks through the mandrel/gasket seal into the lower chamber and deposits onto the underside of the mandrel and onto the ancillary mandrel tooling. Nickel oxide powder is formed in the lower chamber due to the occurring carbonyl reaction with trace oxygen in the inert gas used to purge the bottom chamber. The powder covers all of the inside surfaces and requires extensive cleanup between depositions.

A pressure differential between the top and bottom chamber must be closely monitored. A minor pressure differential causes the gasket to bulge. Any substantial tension on the mandrel/gasket seal will rupture the seal or the gasket.

SUMMARY OF THE INVENTION

There is provided a vapor deposition apparatus that eliminates the need for a large gasket and allows heat transfer fluid to pass into and out of the mandrel by means of a base plate arrangement. The invention eliminates the opportunity for leakage of heat transfer fluid or carbonyl gas.

A base plate or other support structure supports the mandrel and includes at least one aperture. The base plate arrangement incorporates or supports a fluid transfer device such as a bored mandrel ring that mates with the mandrel. Heat transfer fluid directly courses through the fluid transfer device such as a mandrel ring and the mandrel to heat the mandrel. The upper chamber is affixed to the base plate or other support structure. An insulating intermediate base plate ring can be disposed between the mandrel and the base plate to permit expeditious replacement of the mandrel ring. Seals to the base plate are accomplished by using O-rings or other simple sealants.

BRIEF DESCRIPTION OF THE DRAWINGS

FIG. 3 is a plan view of an embodiment of the invention.

FIG. 4 is a cross section taken along line 4—4 in FIG. 3.

PREFERRED EMBODIMENT OF THE INVENTION

Figure 1:
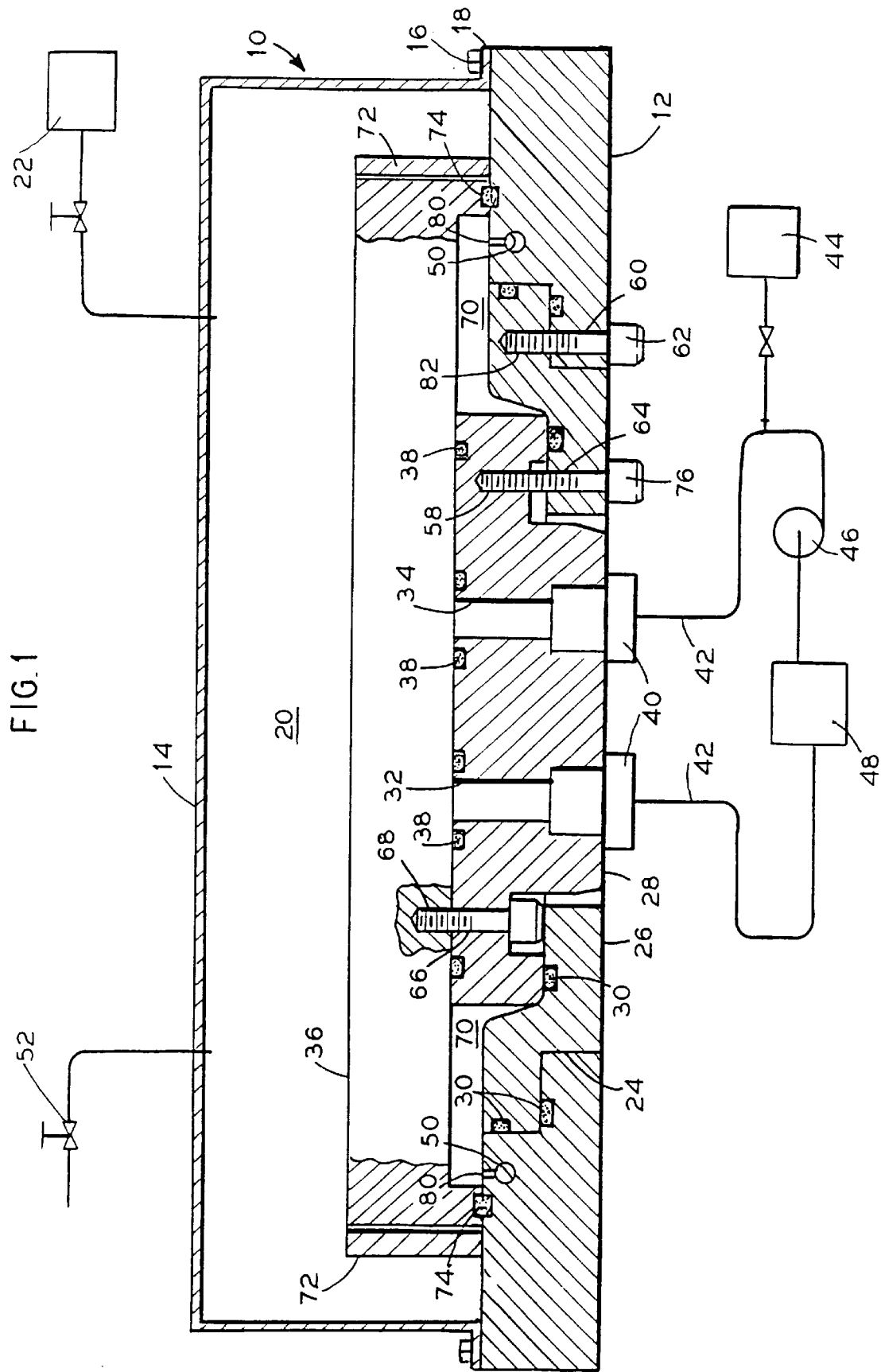
FIG. 1 is an elevation, in partial cross section, of an embodiment of the invention.

Referring to FIG. 1, there is shown a gaseous metal vapor deposition apparatus 10. The apparatus 10 includes a base plate 12 capped by a cover 14 detachably affixed thereto with bolts 16. The cover 14 cooperates with the baseplate 12 to form a chamber 20. A high temperature elastomeric O-ring (i.e. silicone) 18 seals the gap interface between a groove (not shown) in the base plate 12 and the cover 14. A source of carbonyl gas 22 supplies the gas into the chamber 20.

The base plate 12 includes a Z-shaped stepped cutout 24. A corresponding base plate ring 26 nests within the cutout 24. A mandrel ring 28 is disposed on the base plate ring 26 and partially extends into the chamber 20.

A series of high temperature elastomeric O-rings 30 seal the base plate 12/base plate ring 26/mandrel ring 28 combination against carbonyl leakage. A mandrel 36 is affixed to the mandrel ring 28. An elastomeric O-ring 74 seals the mandrel 36 and the base plate 12.

The mandrel ring 28 includes at least one inlet channel 32 and one outlet channel 34 communicating directly with a corresponding manifold (not shown) within the mandrel 36. A series of elastomeric O-rings 38 seal the mandrel 36 with the mandrel ring 28.

In order to ensure the integrity of the apparatus 10, the base plate ring 26 is fastened via a plurality of bolts 62 to the base plate 12. Similarly, the mandrel ring 28 is fastened by a multitude of bolts 76 to the base plate ring 26.

Alternatively, the base plate ring 26 may be welded to the base plate 12, but it is preferably bolted in place to allow replacement of the base plate ring 26 if its surface is damaged. The mandrel ring 28, however, is designed to be removed from the base plate 12. The mandrel ring 28 is first affixed to the mandrel 36 via bolts or fasteners 68. The combined mandrel 36 and mandrel ring 28 is then lowered into position into the base plate 12. Stainless steel is the material of choice for these major components.

Standard SAE type couplings 40 connect conduit 42 to a source of heat transfer fluid 44. The fluid is of conventional composition, i.e. paraffin or mineral oil base (CALFLOW™).

Circulating pump 46 continuously routes the fluid through heater 48 into the inlet channel 32, through the mandrel 36 and then out through the outlet channel 34. The heater 48 heats the heat transfer fluid to maintain the mandrel 36 at a sufficient temperature to decompose the carbonyl gas.

In the event that portions of the mandrel 36 need to be shielded from the plating metal, a silicone mask 72 may be strategically positioned about the mandrel 36.

Figure 2:
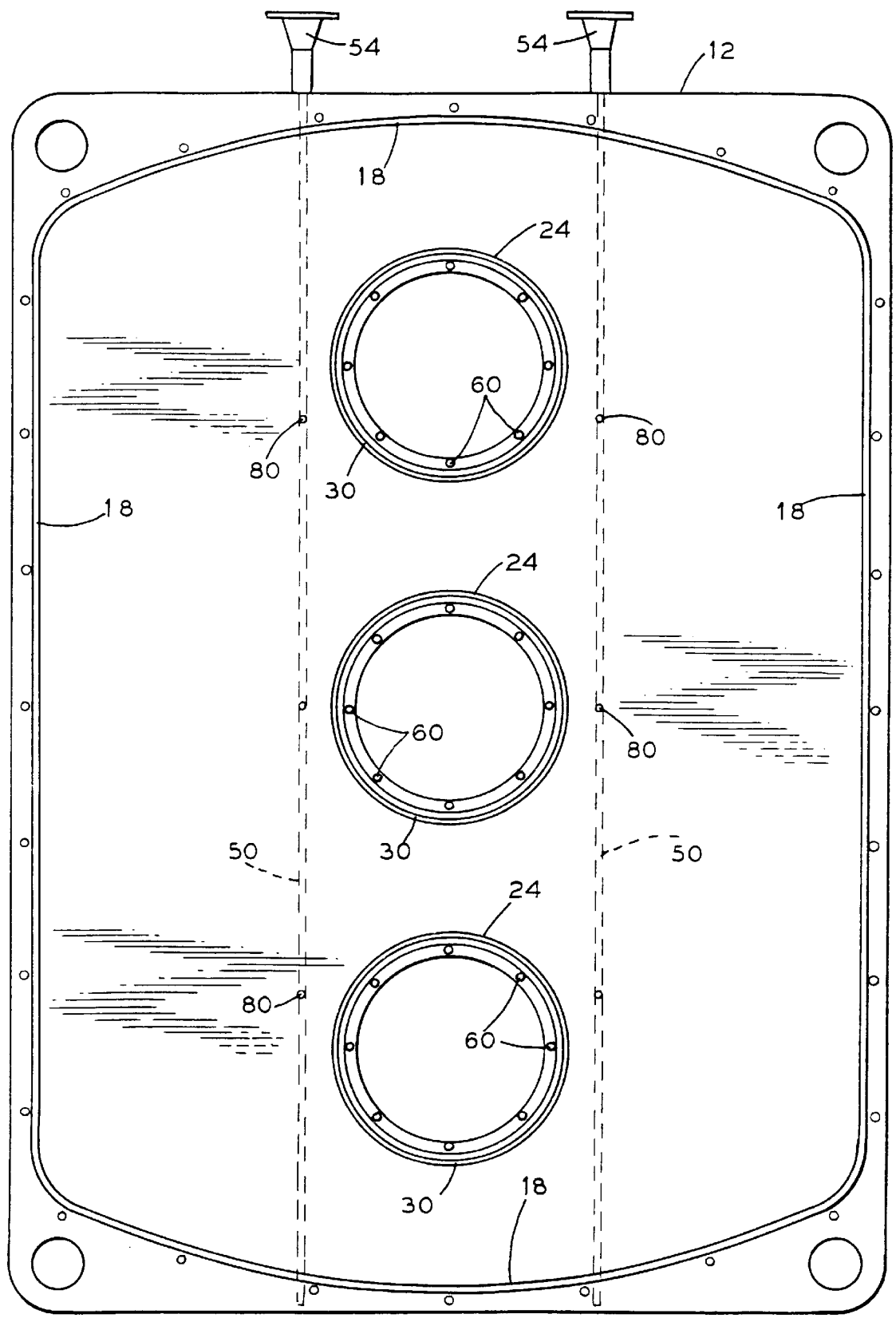
FIG. 2 is a plan view of an embodiment of the invention.

FIG. 2 shows the top view of the base plate 12 in some detail. The O-ring 18 is disposed within a groove in the plate 12. A plurality of the cut-outs 24 ringed by the gaskets 30 are preferably disposed within the plate 12 for economic operation. Apertures 60 accommodate the bolts 62.

Purge channels 50 are affixed to connectors 54 which in turn are connected to a source of purge gas (not shown). The purge channels 50 in the base plate 12 are designed to purge a gap 70 formed between the mandrel 36 and base the plate 12. See also FIG. 1. Purge gas flowing through one flange 54 enters the gap 70 beneath the mandrel 36 via an orifice 80 in the channel 50. The purge gas is eventually vented from the gap 70 through the opposed channel 50 and then to plant vent headers (not shown) via the corresponding connector 54.

In the embodiment shown, each channel 50 has three pairs of orifices 80 aligned so that each mandrel ring 28 has two orifices 80, one in each of the parallel channels 50 to serve as a purge and vent. This design allows for the purge of a small mandrel 36 centered on the middle orifice pair 80, or larger mandrels 36 that cover a greater surface area of the base plate 12.

Purge and vent orifices 80 in channels 50 which cannot be located beneath a mandrel 36 are plugged during the deposition reaction so that the purge gas does not enter the reaction chamber 20 and/or carbonyl gas does not enter the base plate purge and vent channels 50.

The gap 70 is generally purged with inert gases during equipment setup to remove air and with carbon monoxide during the deposition reaction.

The gaseous carbonyl may egress through vent 52. Similarly, vent gas for cleaning out the chamber 20 may also exit through the vent 52. Under normal circumstances, the purge gas introduced by the channels 50 do not vent out of the apparatus 10 through the vent 52.

FIGS. 3 and 4 depict the mandrel ring 28 in plan and cross sectional views respectively. The inlet and outlet channels 32 and 34 pass through the ring 28. A series of grooves accommodate the O-rings 38. The couplings 40 (not shown in FIGS. 3 and 4) are affixed to the channels 32 and 34. Slot 56 traverses the ring 28 to accommodate a temperature probe.

Figure 5:
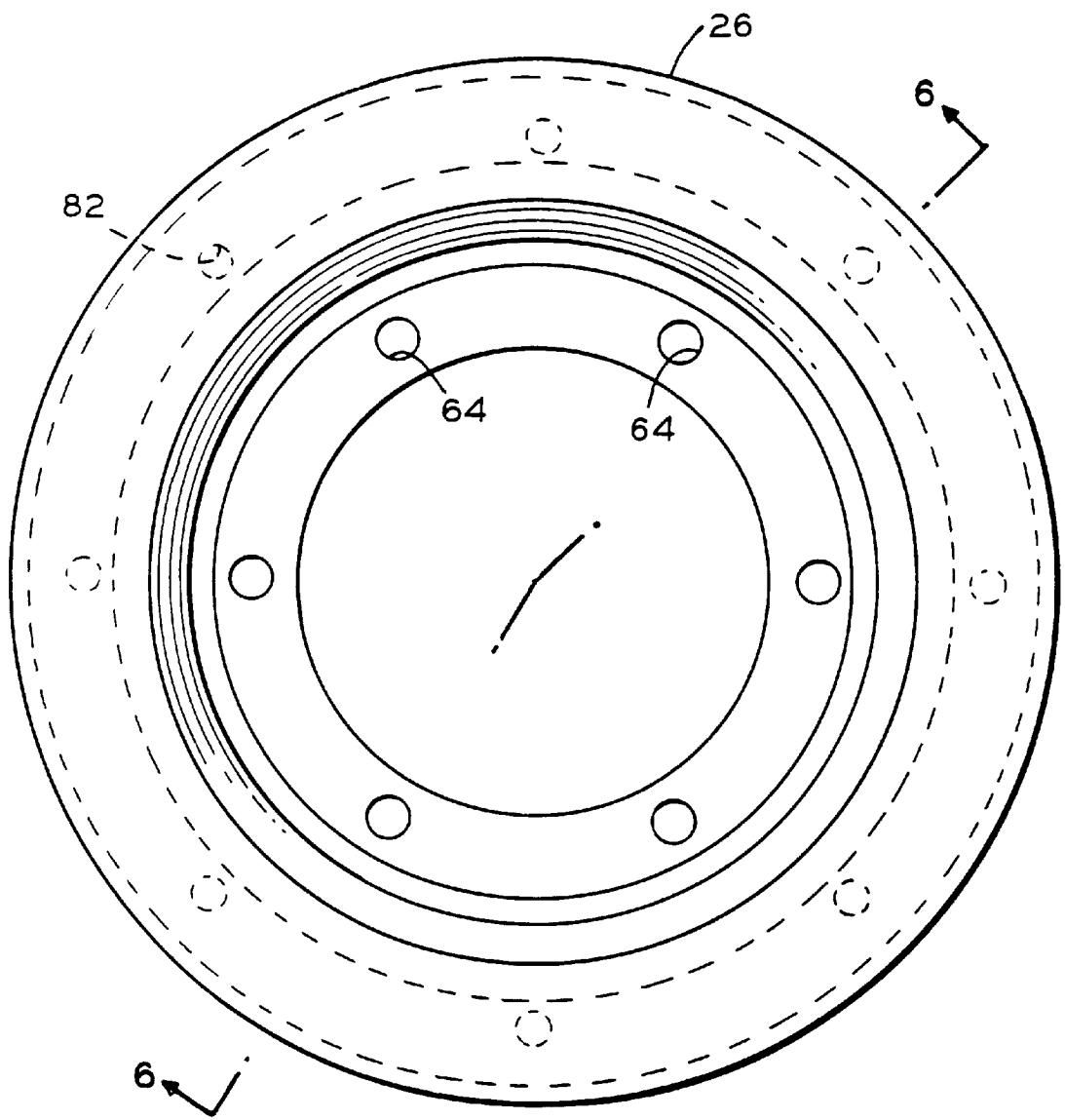
FIG. 5 is a plan view of an embodiment of the invention.
Figure 6:
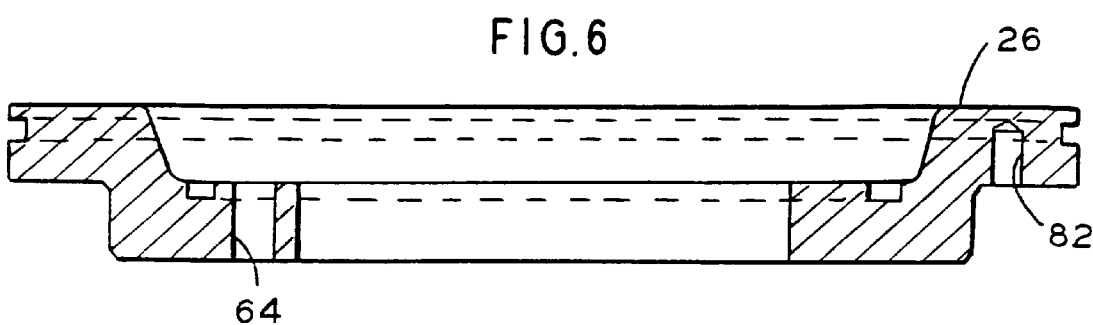
FIG. 6 is a cross section taken along line 6—6 in FIG. 5.

A plurality of blind and tapped bolt holes 58 accept the bolts 76 that pass through corresponding apertures 64 in the base plate ring 26 (see FIG. 5).

A series of passes 66 accommodate the fasteners 68 that connect the mandrel 36 to the mandrel ring 28.

FIG. 5 shows the Z-shaped base plate ring 26 in plan. The apertures 64 match the bolt slots 58 to accommodate the bolts 76. Blind and tapped bolt holes 82 correspond to the apertures 60 in the base plate 12 to accept the bolts 62.

It will be appreciated that the bolts 62 and 76 lock the base plate 12, the base plate ring 26, the mandrel ring 28 and the O-ring gaskets 30 together in a leak resistant fashion.

To assemble the apparatus 10, the mandrel 36 and mandrel ring 28 are lowered into position on the base plate 12 and secured with the bolts 76 through the bolt holes 64 in the base plate ring 28 and into the blind tapped bolt holes 58 in the mandrel ring 28. The bolts 68 in the mandrel 36 are covered by the base plate ring 26 when the mandrel 36 and mandrel ring 28 are bolted to the base plate ring 26. The bolts 62 complete the assembly.

Returning now to FIG. 1, the non-rotating mandrel 36 may be of any shape. Examples include kitchen sink forms and bathroom basin shapes. In order to expedite proper transfer it has been determined that composite or aluminum mandrels 36 are most satisfactory.

It has proved advantageous to form the insulating gap 70 between the mandrel 36 and the base plate 12 to minimize heat transfer to the base plate 12. It will be appreciated that the heat transfer fluid directly passes only through the mandrel ring 28 and the mandrel 36. By reducing conductive heating, less metal will tend to deposit onto the components of the apparatus 10.

Compared to the existing system employing a large silicone gasket, the following advantages may be realized:

A) Eliminates contamination from large surface area silicone gaskets.

B) Minimizes the use (and cost) of silicone gaskets.

C) Eliminates the gasket/mandrel seal.

D) Eliminates heat transfer fluid leakage into the upper chamber.

E) Eliminates nickel carbonyl leakage into the bottom chamber.

F) Eliminates the bottom chamber and associated operating "problems", i.e. control of upper and lower chamber pressure differential, purging bottom chamber, cleaning bottom chamber, isolating/de-isolating bottom chamber. Quicker equipment setup and disassembly.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. An apparatus for decomposing gaseous metal carbonyls, the apparatus comprising a base plate, a cover disposed on the base plate, the cover and the base plate defining a chamber, the base plate including at least one aperture, a base plate ring disposed within the base plate aperture, a mandrel ring nested within the base plate ring, the mandrel ring including at least one fluid conduit disposed therein, the mandrel ring adapted to receive a mandrel, and means for introducing gaseous metal carbonyl into the chamber.

2. The apparatus according to claim 1 wherein a source of heat transfer fluid is flowably connected to the fluid conduit.

3. The apparatus according to claim 1 wherein the mandrel is affixed to the mandrel ring.

4. The apparatus according to claim 1 wherein the mandrel ring extends above the aperture in the base plate.

5. The apparatus according to claim 1 including means for exhausting the chamber of gaseous carbonyl.

6. The apparatus according to claim 1 including means for maintaining the heat transfer fluid at a predetermined temperature.

7. The apparatus according to claim 6 wherein a gap is disposed between the mandrel and the base plate.

8. The apparatus according to claim 1 wherein a purge channel is disposed in the base plate.

9. The apparatus according to claim 1 including means for separating the mandrel from the mandrel ring.

10. The apparatus according to claim 1 wherein first fastening means affix the base plate to the base plate ring and second fastening means affix the base plate ring to the mandrel ring and sealing means are disposed therebetween.

11. The apparatus according to claim 1 including means for sealing the mandrel to the base plate.

* * * * *